United States Patent
Lai et al.

(10) Patent No.: US 8,416,105 B2
(45) Date of Patent: Apr. 9, 2013

(54) ADC CALIBRATION APPARATUS

(75) Inventors: Fang-Shi Jordan Lai, Chia Yi (TW);
Chin-Hao Chang, Hsin-Chu (TW);
Manoj M. Mhala, Hsin-Chu (TW);
Hsu-Feng Hsueh, Tainan (TW);
Yung-Fu Lin, Hsin-Chu (TW); Cheng Yen Weng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 126 days.

(21) Appl. No.: 13/029,754

(22) Filed: Feb. 17, 2011

(65) Prior Publication Data
US 2012/0212359 A1    Aug. 23, 2012

(51) Int. Cl.
*H03M 1/10* (2006.01)
(52) U.S. Cl. .......................... 341/120; 341/155
(58) Field of Classification Search .................. 341/120, 341/155, 159, 161
See application file for complete search history.

(56) References Cited

U.S. PATENT DOCUMENTS

| | | | | |
|---|---|---|---|---|
| 5,861,829 A | * | 1/1999 | Sutardja | 341/122 |
| 6,169,502 B1 | * | 1/2001 | Johnson et al. | 341/120 |
| 7,420,499 B2 | * | 9/2008 | Sakata et al. | 341/155 |
| 7,843,368 B2 | * | 11/2010 | Chen | 341/120 |

* cited by examiner

*Primary Examiner* — Brian Young
(74) *Attorney, Agent, or Firm* — Slater & Matsil, L.L.P.

(57) ABSTRACT

An analog-to-digital (ADC) calibration apparatus comprises a calibration buffer, a comparator and a digital calibration block. Each reference voltage is sent to a track-and-hold amplifier as well as the calibration buffer. The comparator compares the output from the track-and-hold amplifier and the output from the calibration buffer and generates a binary number. Based upon a successive approximation method, the digital calibration block finds a correction voltage for ADC offset and nonlinearity compensation. By employing the ADC calibration apparatus, each reference voltage can be calibrated and the corresponding correction voltage can be used to modify the reference voltage during an ADC process.

20 Claims, 4 Drawing Sheets

US 8,416,105 B2

ADC CALIBRATION APPARATUS

BACKGROUND

The majority of signals received by an electronic device such as a mobile phone are analog signals. An analog signal is a signal having a continuous range of analog signal levels. On the other hand, the processor of the electronic device can only process digital data. Therefore, an intermediate device is required to convert analog signals into a binary form of ones and zeros for digital processing. Such an intermediate device is called an analog-to-digital converter (ADC). There are a variety of ADC architectures including pipelined, flash, Sigma-Delta, successive approximation and the like.

An n-bit flash ADC comprises five parts: a reference voltage generator, a track-and-hold (TH) amplifier, a comparator array, a latch device array and an encoder. In the n-bit flash ADC, a reference voltage generator is typically formed by $2^n$ resistors connected in series between a Ref+ voltage and a Ref− voltage to produce $2^n-1$ reference voltage levels for respective reference inputs of the comparator array. The comparator array comprises $2^n-1$ comparators, each of which receives an analog signal via the TH amplifier and a reference voltage from the reference generator. Each comparator generates a digital number based upon the sign of the difference between two inputs. Such a digital number is sent to the encoder via a latch device array. The encoder generates an n-bit binary code, which can be processed by digital devices, such as digital signal processors, central process units, microcontrollers or the like.

In an ADC, some errors such as comparator offsets and amplifier nonlinearity errors may affect the accuracy of the ADC. These errors need to be addressed for the optimum performance of the ADC. To address the issues of offsets and nonlinearity in Flash ADC different architectures based on averaging and interpolation, pre-distorted reference and a combination of both have been proposed and tried. While the first type can compensate comparator offsets only, the second type can take care of offset or non-linearity but not both. The third technique, though proposed to compensate both offsets and nonlinearity, is not effective to compensate either. Moreover, most of the techniques require an external calibration input.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a flash analog-to-digital converter (ADC). The invention may also be applied, however, to a variety of ADC architectures.

Figure 1:
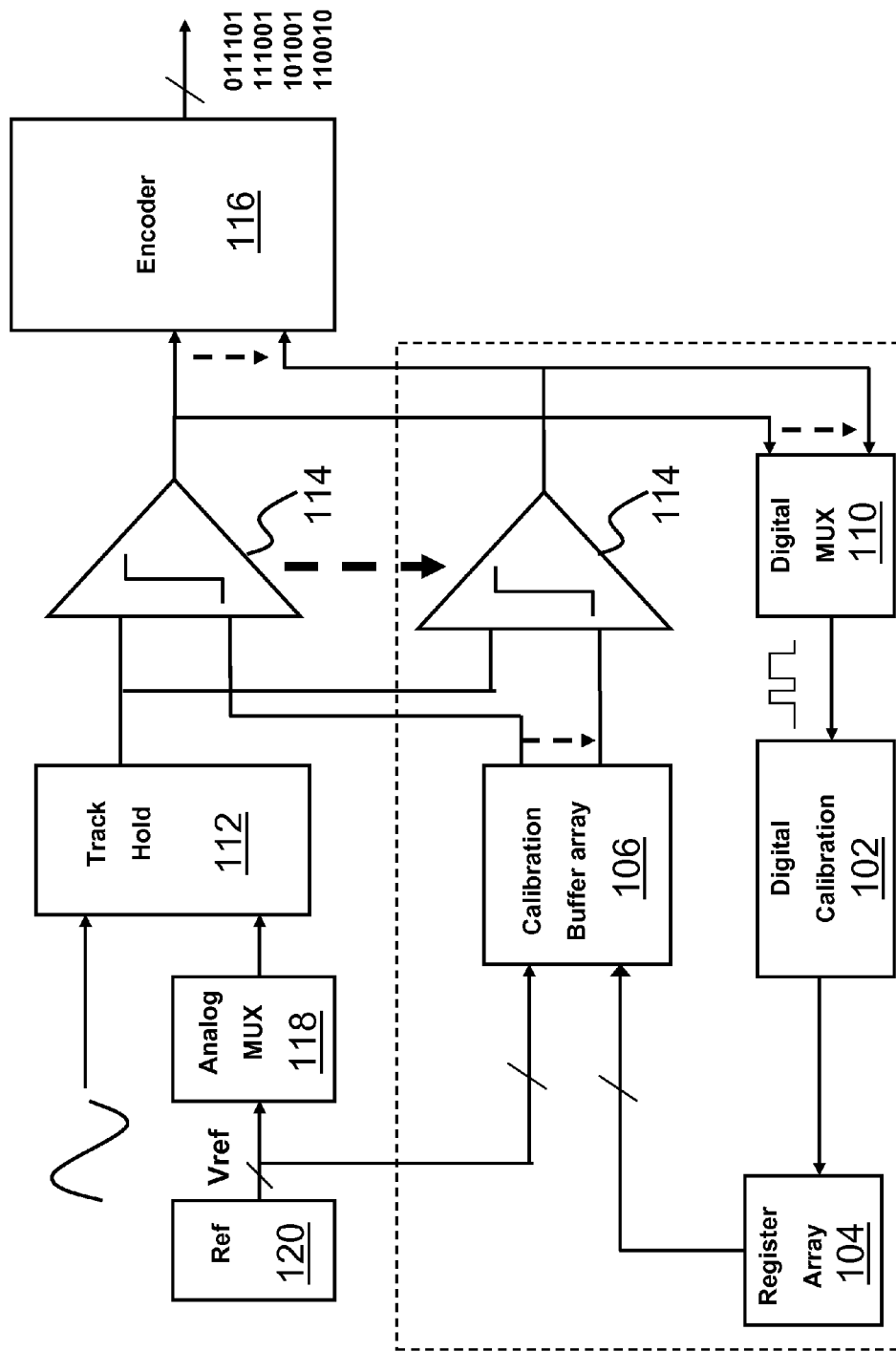
FIG. 1 illustrates a block diagram of a flash analog-to-digital converter (ADC) having an ADC calibration apparatus.

Referring initially to FIG. 1, a block diagram of a flash ADC having an ADC calibration apparatus is illustrated. The flash ADC comprises a track-and-hold (TH) amplifier 112, a comparator array 114, a reference generator 120 and an encoder 116. In an ADC process, the TH amplifier 112 receives an analog signal and samples the analog signal at a particular voltage level and holds the voltage level as the analog signal's voltage for a specified period of time. In accordance with the operation of a flash ADC, the comparator array 114 may comprise $2^n-1$ comparators for an n-bit ADC process. The reference generator 120 may generate $2^n-1$ reference voltage levels used for the reference inputs of the $2^n-1$ comparators. For instance, in a 10-bit ADC process, a flash ADC requires $2^{10}-1$ or approximately one thousand comparators and reference voltage levels. In such a 10-bit ADC, the sampled analog signal voltage is compared with $2^{10}-1$ reference voltages from the reference generator 120 at the comparator array 114 comprising $2^{10}-1$ comparators, and thus a logic high state or a logic low state is generated at each comparator's output depending on if the sampled analog signal voltage is higher or lower than the reference voltage at each comparator. The encoder 116 receives the comparison results from the $2^{10}-1$ comparators and generates a 10-bit discrete number based upon the $2^{10}-1$ logic states from the output of the comparator array 114.

FIG. 1 further illustrates an ADC calibration apparatus 100 comprising a calibration buffer 106, the comparator array 114, a digital multiplexer 110, a digital calibration unit 102 and a register array 104. It should be noted that the comparator array shown in the ADC calibration apparatus 100 is the same comparator used in the ADC process. As indicated by the dashed arrow, the comparator array 114 is reused in a calibration process. It should be further noted that while the comparator array 114 shows a single comparator, the comparator array may accommodate a variety of comparators. The comparator array 114 shown in FIG. 1 is for illustration purposes only. A person having ordinary skill in the art will realize a variety of alternatives, modifications and variations.

In a calibration process, the TH amplifier 112 disables analog signal sampling by turning off a switch (not shown but illustrated in FIG. 2) coupled between the analog signal and the input of the TH amplifier 112. Subsequently, the TH amplifier 112 starts to sample and hold a reference voltage by turning on the other switch (not shown but illustrated in FIG. 2) coupled between the reference generator 120 and the input of the TH amplifier 112. After passing the TH amplifier 112, the reference signal at one input of one comparator of the comparator array 114 comprises the reference voltage plus an offset error due to process mismatch and a nonlinearity error due to high-speed open loop operation.

On the other hand, the reference signal is sent to the calibration buffer 106 as well. Likewise, after passing the calibration buffer 106, the reference signal at the other input of the comparator of the comparator array 114 comprises the reference voltage, the offset and nonlinearity errors induced by the calibration buffer 106 and a correction voltage generated in the calibration buffer corresponding to the digital output received from the digital calibration unit 102. One comparator of the comparator array 114 compares two input signals each of which comprises the reference signal and offset and nonlinearity errors, and generates a logic high state or a logic low state depending if one input signal is higher or lower than the other input signal. The comparison result is sent to the digital calibration unit 102 via the digital multiplexer 110.

The digital calibration unit 102 is used to generate a digital correction code based upon the comparison result at the comparator array 114. The detailed description of the digital calibration unit 102 will be described below with respect to FIG. 3B. Nevertheless, the main purpose of using the digital calibration unit 102 is to identify the digital equivalent of the correction voltage reflecting the difference between the TH amplifier 112 and the calibration buffer 106. Furthermore, the digital output code corresponding to the correction voltage is saved into a register and will be used to modify the reference voltage in an ADC process so that the offset and nonlinearity errors can be compensated. An advantageous feature of the ADC calibration apparatus 100 is that both the offset error and the nonlinearity error of a TH amplifier can be better estimated during one single calibration process and both errors can be corrected by modifying the reference voltage based upon a correction voltage generated from the ADC calibration apparatus 100.

Figure 2:
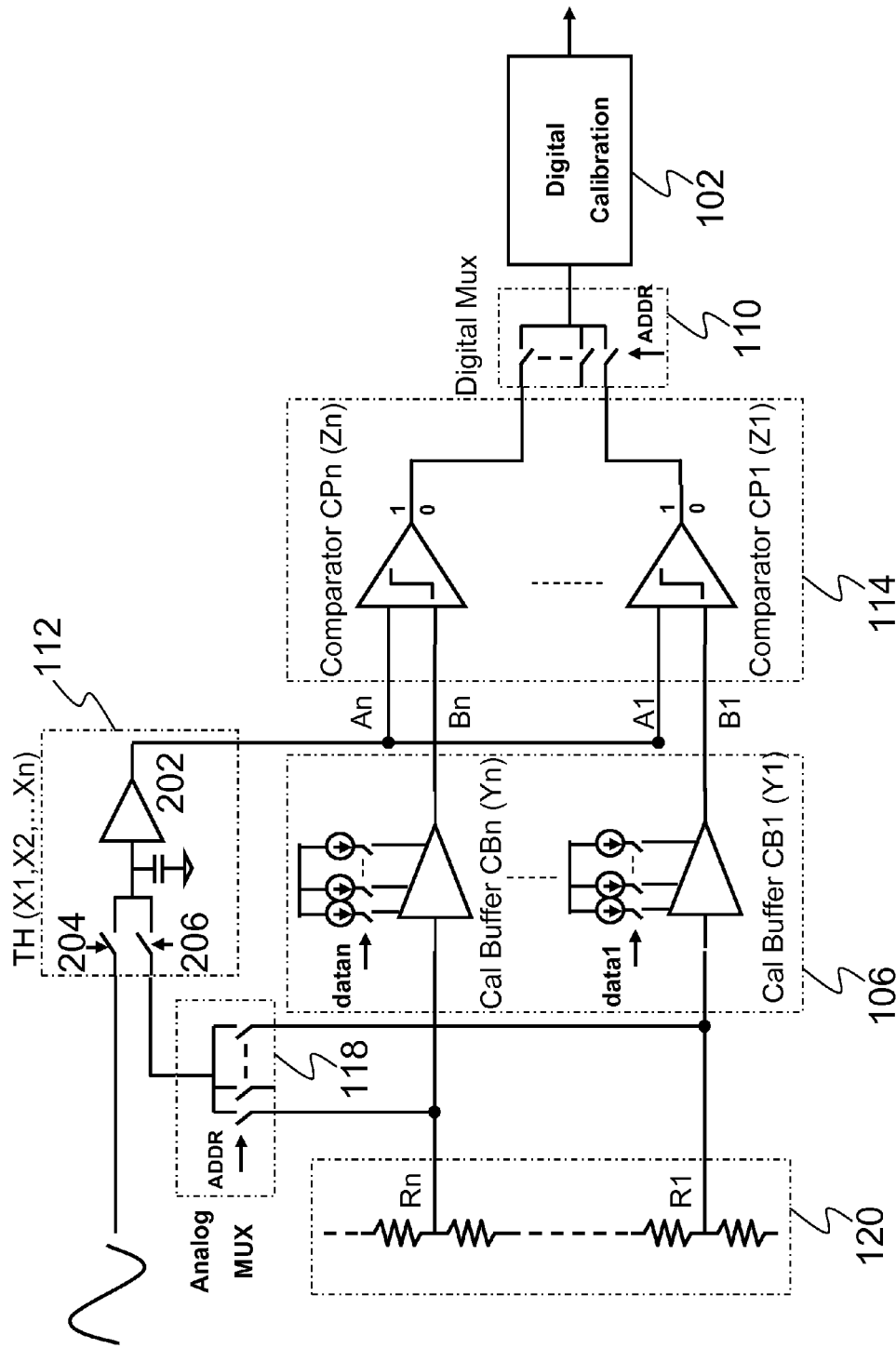
FIG. 2 illustrates an exemplified ADC having N reference voltages.

FIG. 2 illustrates an exemplified ADC having N reference voltages. As known in the art, an n-bit flash ADC process requires $2^n-1$ references voltages. In order to better illustrate the operation of the ADC calibration apparatus 100, hereinafter, N is used to replace $2^n-1$. As shown in FIG. 2, the reference generator 120 comprises (N+1) resistors in series to produce N precisely spaced voltage levels from R1 to RN. It should be noted that while the reference generator 120 is formed by (N+1) resistors in series, the reference generator 120 can be formed by other voltage dividers, such as a capacitive voltage divider. A person having ordinary skill in the art should realize there are many alternatives for generating N precisely spaced reference voltage levels.

In the exemplified ADC shown in FIG. 2, the TH amplifier 112 comprises a buffer 202 and two controllable switches 204 and 206. During an ADC process, the switch 206 remains off and the switch 204 is turned on during a sampling period so that the TH amplifier 112 can sample the input analog signal and holds the sampled voltage at the input capacitor of the buffer 202. On the other hand, during an ADC calibration process, the switch 204 is turned off and the switch 206 is turned on so that the TH amplifier 112 samples a reference voltage signal and a calibration process proceeds. During such a calibration process, the reference voltage signal is sent to a calibration buffer as well. For example, when reference voltage Rn is calibrated, as shown in FIG. 2, a control program (not shown) enables the corresponding ADDR controlling the on/off of the switch between Rn and the input of the TH amplifier 112 so that Rn is selected and sent to the input of the TH amplifier 112. At the same time, Rn is sent to the calibration buffer CBn.

As shown in FIG. 2, a reference voltage (e.g., Rn) is sent to two different paths. In the first signal path formed by the TH amplifier 112, the reference signal becomes a first input signal An of a comparator CPn after passing the TH amplifier 112. The first input signal An comprises the reference voltage Rn and a TH amplifier error Xn due to offset and nonlinearity. In the second signal path formed by the calibration buffer CBn, the reference signal Rn becomes a second input signal Bn of the comparator CPn after passing the calibration buffer CBn. The second input signal Bn comprises the reference voltage Rn, an offset and nonlinearity error Yn from the calibration buffer CBn and a correction voltage Cn. At the beginning of a calibration process, Cn is equal to zero. During a calibration process, the correction voltage Cn is obtained through a successive approximation register (SAR) method. The detailed operation of generating Cn through the SAR method will be described in detail with respect to FIGS. 3A and 3B.

Both An and Bn are compared at the comparator CPn. In consideration of an offset Zn from the comparator CPn, when An and Bn are compared at the comparator CPn, An may further comprise the offset Zn. In short, An is the sum of the reference voltage Rn, the TH amplifier offset and nonlinearity error Xn and the comparator offset Zn. Similarly, Bn comprises the reference voltage Rn, the calibration buffer CBn offset and nonlinearity error Yn and the correction voltage Cn. In accordance with the operation of the comparator CPn, the comparator CPn generates a logic high state when An is larger than Bn. On the other hand, CPn generates a logic low state when An is smaller than Bn. A control program (not shown) enables the corresponding ADDR for Rn at the digital multiplexer 110 and selects the output of the comparator CPn and forwards the selected signal from the digital multiplexer 110 to the digital calibration unit 102.

Figure 3B:
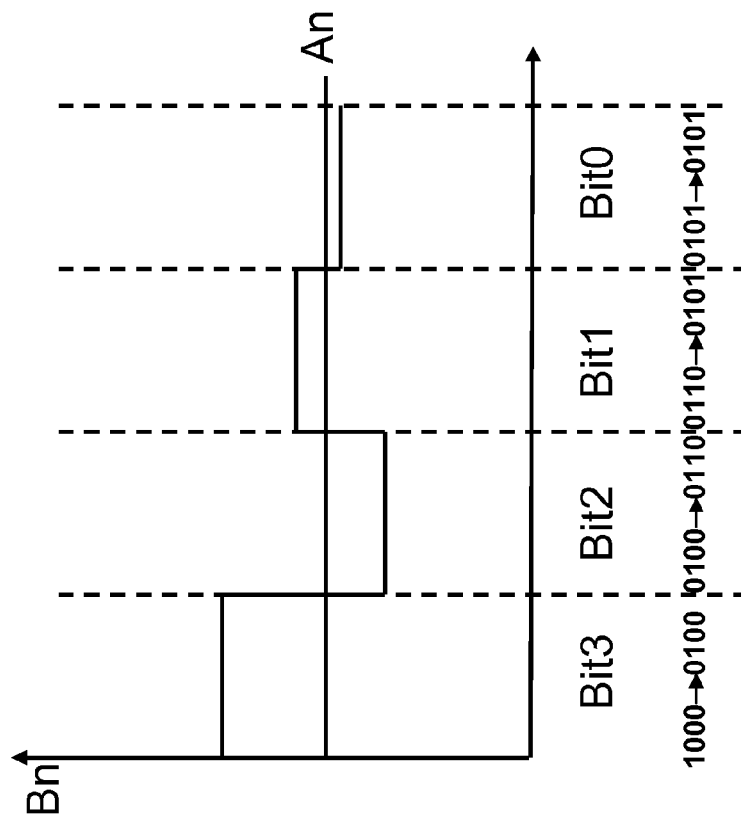
FIG. 3B illustrates the operation of the digital calibration block.
Figure 3A:
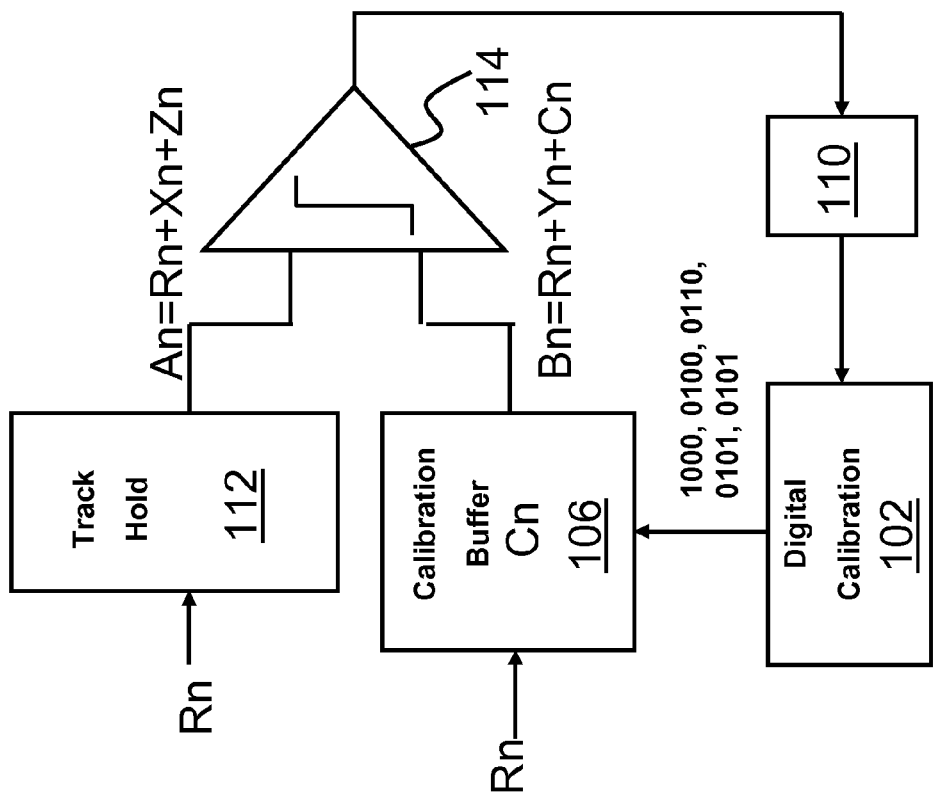
FIG. 3A illustrates a block diagram of generating a correction voltage based upon a successive approximation register (SAR) method.

FIG. 3A illustrates a block diagram of generating a correction voltage based upon the SAR method. As described above with respect to FIG. 2, the output of the TH amplifier 112 An comprises the reference voltage Rn, the TH amplifier 112 offset and nonlinearity error Xn and the comparator CPn offset Zn. Bn comprises the reference voltage Rn, the calibration buffer CBn offset and nonlinearity error Yn and the correction voltage Cn. The digital calibration unit 102 receives the comparison result from the comparator array 114 and generates a digital code based upon the SAR method. The calibration buffer converts this digital code to a modified Cn value through a built-in DAC. Depending on the total bit number of the SAR method, the digital calibration unit 102 repeats the modification process until it estimates the correct digital code corresponding to a modified Cn that can make Bn close to An. The final digital code will be saved in a register array (e.g., register array 104 shown in FIG. 1). When an ADC process occurs, the final digital code saved in the register memory is used to generate a Cn which is used to modify the reference voltage Rn so that the error induced by offsets and nonlinearity of the TH amplifier 112 can be compensated.

FIG. 3B uses an example to illustrate the operation of the digital calibration unit 102. FIG. 3B shows a waveform generated from the calibration buffer unit 106 based upon a 4-bit SAR. As known in the art, a 4-bit SAR includes an SAR logic unit, a 4-bit register and a 4-bit digital-to-analog converter (DAC). According to the operation of SAR, the SAR logic unit receives a digital number from a comparator and sets the output of the 4-bit register based upon the SAR algorithm. The 4-bit DAC converts the output of the 4-bit register into an analog voltage. Such an analog voltage is used to modify an input of the comparator. The SAR logic unit repeats the process described above again until the SAR algorithm finds an output voltage that can make two inputs of the comparator as close as possible. The output of the digital calibration unit 102 which is successively approximated digital code will be saved in the register array 104.

FIG. 3B illustrates a 4-bit SAR calibration process. In a 4-bit SAR, the maximum analog signal the 4-bit SAR can accommodated is called the Full Scale (FS), which corresponds to a digital discrete number "1111" generated from the 4-bit register. According to the SAR method, Cn in the calibration buffer 106, is set to generate a FS/2 corresponding to the digital output 1000 of the 4-bit register in the digital calibration unit 102. The output of the calibration buffer 106 Bn is modified accordingly to reflect the change in Cn.

Subsequently, the output of the TH amplifier 112 An is compared with Bn at the comparator array 114, which will generate a logic state "1" when An is larger than Bn. On the other hand, it will generate a logic state "0" when An is smaller than Bn. As shown in FIG. 3B, Bn is larger than An, and then the MSB changes from "1" to "0" in response to the change at the output of the comparator array 114. At the same time, bit 2 is set to "1" for the next comparison. In response to the change at the output of the digital calibration unit 102 from "1000" to "0100", the internal 4-bit DAC (not shown) in the calibration buffer sets Cn to FS/4. As described above with respect to the first comparison, FS/4 is used to replace the previous Cn. As a result, Bn's value is reduced by FS/4. An and newly modified Bn are compared again at the comparator array 114. As shown in FIG. 3B, during the second bit comparison, Bn is smaller than An. According to the SAR algorithm described above, bit 2 remains "1" and bit 3 is set to "1" for the third bit comparison. The output of the SAR is "0110", which is equivalent to 3FS/8 after passing the internal 4-bit DAC (not shown).

In the third bit comparison, Bn's value is increased by FS/8 reflecting the change at Cn from FS/4 to 3FS/8. As shown in FIG. 3B, during the third bit comparison, the modified Bn is larger than An. As a result, the comparator array 114 sends "0" to the digital calibration block 102. In accordance with the SAR algorithm, the SAR register set bit 1 as "0" and set bit 0 as "1" for the last bit comparison. The internal 4-bit DAC (not shown) generates 5FS/16 in response to the input discrete number "0101". In the final comparison, the comparator 114 generates "0" because Bn is smaller than An. Accordingly, bit 0 remains "1". The last output of the digital calibration block 102 represents difference between the TH buffer 112 and the calibration buffer 106. As shown in FIG. 3B, by employing the SAR method, the estimate of Cn can be fine-tuned during each bit of the SAR until a relatively accurate Cn is determined. It should be noted the example described above is used to illustrate the inventive aspects of the present invention. A person having ordinary skill in the art will realize many alternatives, modifications and changes. For example, a multiple bit SAR register other than 4-bit SAR can be employed to pursue a more accurate estimate of the difference between the TH amplifier 112 and the calibration buffer 106. In summary, the SAR algorithm is used to determine the difference between the TH amplifier 112 and the calibration buffer 106. The output of the digital calibration unit 102 represents the difference between An and Bn which is the sum of offsets and nonlinearity for a given reference Rn.

Figure 4:
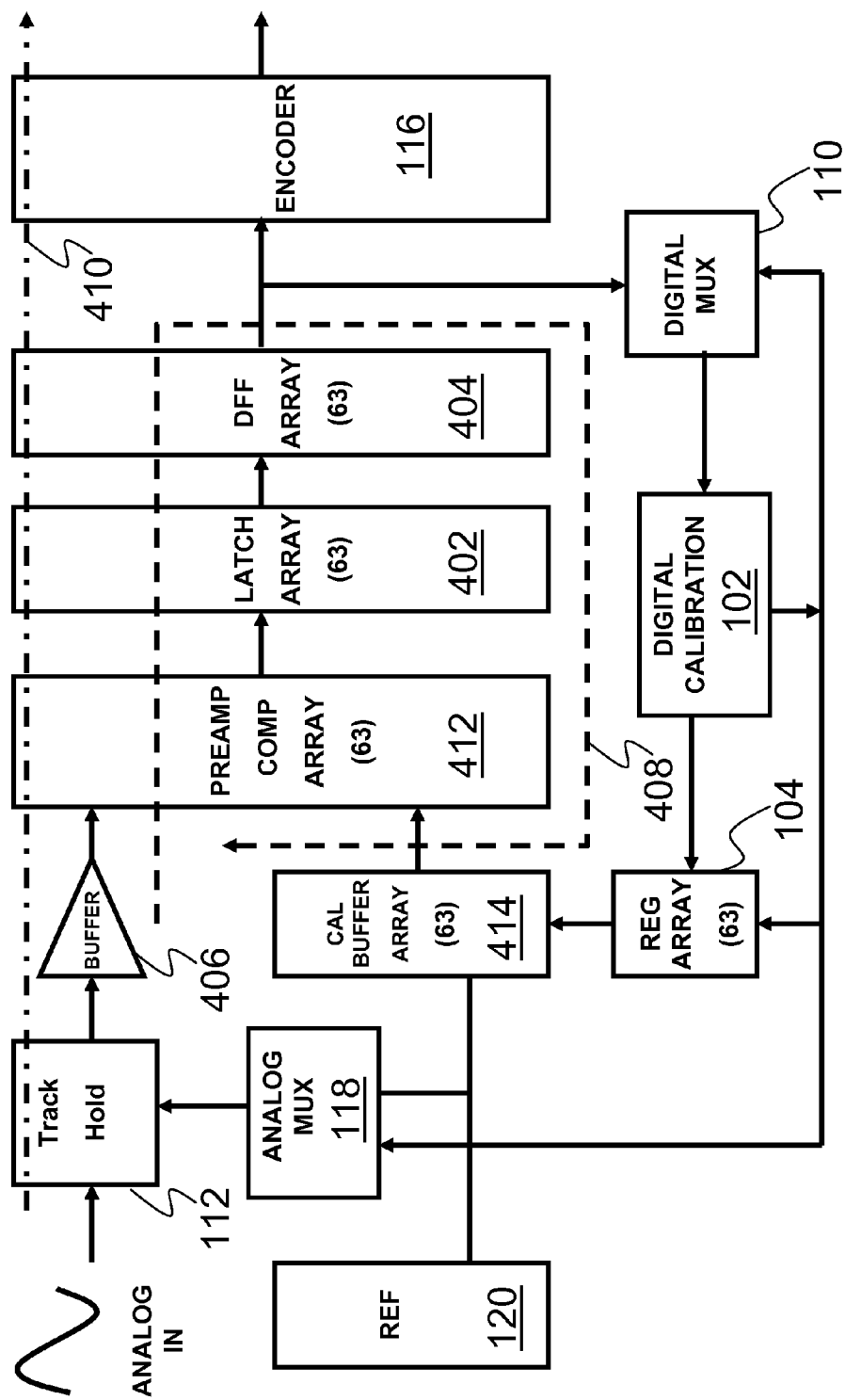
FIG. 4 illustrates an exemplified 6-bit flash ADC with the ADC calibration apparatus.

FIG. 4 illustrates an exemplified 6-bit flash ADC with the ADC calibration apparatus 100. The 6-bit ADC requires sixty-three comparators and corresponding latches and digital flip-flops. In order to calibrate each voltage reference level, the ADC calibration apparatus 100 comprises sixty-three calibration buffers. As indicated by a dashed line 410, an analog signal goes through the TH amplifier 112, a buffer 406 and a preamplifier array 412, which includes sixty-three comparators. Each comparator compares the instantaneous value of the analog signal and a reference voltage and generates a digital output voltage based on the sign of the difference between two input signals. A latch array 401 and a digital flip-flop array 404 are used to latch the output of the preamplifier 412 and generate a quick transition to the full binary output swing. As known in the art, the detailed operation of the latch array 401 and the digital flip-flop array 404 will be not discussed herein. The encoder 116 converts sixty-three outputs from the digital flip-flop array 404 to a 6-bit binary code.

On the other hand, when the 6-bit ADC system is in calibration mode, the TH amplifier 112 stops receiving the analog signal. Instead, the TH amplifier 112 receives a reference voltage (e.g., Rn). In the 6-bit ADC, the reference generator 120 comprises sixty-three reference levels. In order to correct the errors induced by offset and nonlinearity, each reference voltage (e.g., Rn) is sent to the TH amplifier 112 as well as a calibration buffer array 414. As indicated by a dashed line 408, the reference voltage goes through two different paths and becomes two different signals at the input of the preamplifier comparator array 412. One comparator corresponding to the reference voltage level in the preamplifier comparator array 412 compares two input signals and generates a digital output. As indicated by the dashed line 408, the digital calibration unit 102 receives the digital output and finds a correction voltage based upon the SAR method described above with respect to FIG. 3B. The correction voltage is saved in a register array 104. The ADC calibration apparatus 100 repeats the calibration process for each reference voltage until all sixty-three reference voltages have been fully calibrated. In the subsequent ADC process, the correction voltages saved in the register array 104 can be used to modify each reference voltage so that the errors induced by offset and nonlinearity can be compensated. An advantageous feature of employing the ADC calibration apparatus 100 is that the correction of errors due to offset and nonlinearity can be achieved within one single calibration process.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
 a reference generator being configured to generate a plurality of reference voltages and send each reference voltage to both a track-and-hold (TH) amplifier and a calibration buffer;
 the TH amplifier having an input coupled to the reference generator and an output coupled to a plurality of comparators;

the calibration buffer having a first input coupled to the reference generator, a second input receiving a correction voltage from a digital calibration unit and an output coupled to one comparator of the plurality of comparators;

the comparator being configured to generate a digital number by comparing the output of the calibration buffer and the output of the TH amplifier; and the digital calibration unit being configured to receive the digital number and generate the correction voltage.

2. The apparatus of claim 1, further comprising an analog multiplexer being configured to select a reference voltage based upon a reference voltage calibration signal.

3. The apparatus of claim 1, further comprising a digital multiplexer being configured to select a comparator based upon the reference voltage calibration signal.

4. The apparatus of claim 1, further comprising a register array wherein the correction voltage is stored.

5. The apparatus of claim 1, wherein the digital calibration unit employs a successive approximation register (SAR) method to find the correction voltage.

6. The apparatus of claim 1, wherein the correction voltage is used to modify a corresponding reference voltage so as to reduce offset and nonlinearity errors during an analog-to-digital conversion (ADC) process.

7. The apparatus of claim 1, further comprising:
a first switch at the input of the TH amplifier being configured to select an ADC input signal; and
a second switch at the input of the TH amplifier being configured to select a reference voltage during a calibration process.

8. A system comprising:
an analog-to-digital converter (ADC) comprising:
a reference generator being configured to receive a plurality of correction voltages and generate a plurality reference voltages modified by the plurality of correction voltages;
a track-and-hold (TH) amplifier having an input receiving an analog signal;
a buffer coupled between an output of the TH amplifier and a preamplifier array;
the preamplifier array being configured to generate a group of digital numbers; and
an encoder coupled to the preamplifier array, the encoder being configured to generate a digital code; and
an ADC calibration apparatus comprising:
a calibration buffer array including a plurality of calibration buffers, each of which having a first input coupled to the reference generator, a second input receiving a correction voltage from a digital calibration unit and an output coupled to one preamplifier of the preamplifier array;
the preamplifier being configured to generate a digital number by comparing an output of a calibration buffer and the output of the TH amplifier; and
the digital calibration unit being configured to receive the digital number and generate the correction voltage.

9. The system of claim 8, further comprising:
a first switch at the input of the TH amplifier, the first controllable switch being configured to select the analog signal; and
a second switch at the input of the TH amplifier, the second controllable switch being configured to select a signal from the reference generator.

10. The system of claim 8, further comprising a latch array coupled to the preamplifier array, the latch array being configured to latch the digital numbers from the preamplifier array.

11. The system of claim 8, further comprising a digital flip-flop array coupled between a latch array and the encoder.

12. The system of claim 8, wherein the preamplifier array is configured such that:
if an ADC calibration process is asserted, one comparator of the preamplifier array is used to compare an output of a calibration buffer and the output of the TH amplifier when the TH amplifier samples and holds a reference voltage; and
if an ADC is asserted, the comparator of the preamplifier array is used to compare a reference voltage and the output of the TH amplifier when the TH amplifier samples and holds the analog signal.

13. The system of claim 8, wherein the digital calibration unit employs a successive approximation register (SAR) method to find a correction voltage for each of the plurality of reference voltages.

14. The system of claim 8, further comprising a register array being configured to store a plurality of correction voltages generated from the digital calibration unit.

15. A method comprising:
generating a reference voltage from a reference generator;
sending the reference voltage to both a track-and-hold (TH) amplifier and a calibration buffer;
comparing an output of the TH amplifier and an output of the calibration buffer, wherein the output of the TH amplifier comprises the reference voltage;
generating a digital number;
generating a correction voltage based upon the digital number from a digital calibration unit; and
modifying the reference voltage based upon the correction voltage.

16. The method of claim 15, further comprising:
selecting an analog input signal by turning on a first switch during an analog-to-digital conversion (ADC); and
selecting the reference voltage by turning off the first switch and turning on a second switch during an ADC calibration process.

17. The method of claim 15, wherein the digital calibration unit employs a successive approximation register (SAR) method to find a correction voltage for the reference voltage.

18. The method of claim 15, further comprising:
sampling and holding an analog signal at the TH amplifier;
comparing the reference voltage being modified with the analog signal;
generating a group of digital numbers;
latching the group of digital numbers; and
generating a binary code based upon the group of digital numbers.

19. The method of claim 15, further comprising:
coupling the reference generator with an analog multiplexer;
selecting the reference voltage by sending a reference voltage address signal to the analog multiplexer; and
sending the reference voltage to the TH amplifier.

20. The method of claim 15, further comprising:
coupling a plurality of comparators to a digital multiplexer;
selecting an output of the plurality of comparators by sending a reference voltage address signal to the digital multiplexer; and
sending the output to the digital calibration unit.

* * * * *